United States Patent [19]

Takanashi et al.

[11] Patent Number: 4,480,910
[45] Date of Patent: Nov. 6, 1984

[54] PATTERN FORMING APPARATUS

[75] Inventors: Akihiro Takanashi, Kokubunji; Tatsuo Harada, Fuchu; Masamoto Akeyama, Kokubunji; Yataro Kondo, Koganei; Toshiei Kurosaki; Shinji Kuniyoshi, both of Tokyo; Sumio Hosaka, Hachioji; Yoshio Kawamura, Tokyo, all of Japan

[73] Assignee: Hitachi, Ltd., Tokyo, Japan

[21] Appl. No.: 358,436

[22] Filed: Mar. 15, 1982

[30] Foreign Application Priority Data

Mar. 18, 1981 [JP] Japan .................. 56-37977

[51] Int. Cl.³ .............. G03B 27/52; G03B 27/68
[52] U.S. Cl. ................................. 355/30; 355/52
[58] Field of Search ............. 355/52, 30, 75, 27; 352/5; 354/195

[56] References Cited

U.S. PATENT DOCUMENTS

| 2,073,287 | 3/1937 | Sandvik | 352/5 |
|---|---|---|---|
| 3,115,815 | 12/1963 | Friedel | 355/27 |
| 3,473,874 | 10/1969 | Hall et al. | 355/75 |
| 3,554,641 | 1/1971 | Jeffee et al. | 355/30 |
| 3,614,223 | 10/1971 | Ott | 355/30 |
| 3,648,587 | 3/1972 | Stevens | 354/195 |
| 3,794,421 | 2/1974 | Kano et al. | |
| 3,893,763 | 7/1975 | Ott | 355/30 |
| 4,153,371 | 5/1979 | Koizumi et al. | |
| 4,209,250 | 6/1980 | James et al. | 355/30 |

FOREIGN PATENT DOCUMENTS 23231 5/1981 European Pat. Off. .

OTHER PUBLICATIONS

"Reduction of Waste Resulting from Mask Defects," Solid State Technology, Aug. 1978, G. W. W. Stevens, pp. 68-70.

Primary Examiner—Monroe H. Hayes
Attorney, Agent, or Firm—Antonelli, Terry & Wands

[57] ABSTRACT

There is disclosed a pattern forming apparatus for projecting a pattern which is formed on a reticle upon a photoresist layer on a substrate which comprises an illumination system for illuminating the pattern for forming an optical image, a reduction lenses for reducing the optical pattern image at a certain reduction ratio and projecting the reduced optical pattern image upon the photoresist layer formed on the substrate for exposing the photoresist layer, and liquid sustaining means for filling a gap between at least a portion of the reduction lenses and the photoresist layer with an optically transparent liquid having a refractive index of more than 1 (one).

15 Claims, 4 Drawing Figures

PATTERN FORMING APPARATUS

This invention relates to an apparatus for forming a pattern of a large scale integration semiconductor element by utilizing a fine pattern.

Of the processes utilized in fabrication of semiconductors, the lithography process for the formation of a fine pattern on a substrate is the most important and photolithography using light plays the leading role today in the lithography process.

In the lithography process, as larger integration of the semiconductor elements prevails, it is required to improve resolution of the fine pattern and pattern alignment necessary for the formation of the fine pattern at a desired position.

With the photolithography, however, the wavelength of light for exposure constrains the resolution to a limit in the formation of a fine pattern having a line width of about 1 μm.

In order to assure the pattern alignment, it is also required to detect the position of the pattern to be formed on the substrate with high precision.

Description will be made hereinbelow in conjunction with the accompanying drawings, in which.

Figure 1:
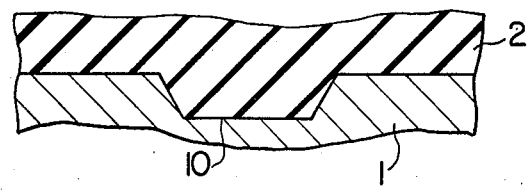
FIG. 1 is a fragmentary sectional view of a substrate useful in explaining disadvantages encountered in a prior art pattern forming apparatus.

Referring to FIG. 1, a pattern 10 formed on a substrate 1 and to be detected for aligning the substrate 1 is covered with a photoresist layer 2 with an uneven surface. Therefore, refraction of light for pattern detection becomes irregular, thus impairing precise position detection.

This invention contemplates the elimination of the above drawbacks and has for its object to provide a novel pattern forming apparatus effective to improve resolution of a fine pattern and precision of the pattern alignment.

According to one aspect of the present invention, there is provided a pattern forming apparatus for projecting a pattern, which is formed in advance on a reticle, upon a workpiece at a certain reduction ratio, comprising an illumination system for illuminating the pattern for forming an optical pattern image, reduction lenses for projecting the optical pattern image at a certain reduction ratio upon a photoresist layer formed on a substrate to expose the photoresist layer, and liquid sustaining means for filling a gap between at least a portion of the reduction lenses and the photoresist layer with an optically transparent liquid having a refractive index of more than 1 (one).

Now, description will be made in detail, by way of example, of preferred embodiments of this invention.

The fundamental principle of the present invention will first be described. In general, the resolution limit R (μm) of a pattern projection optics used for the pattern formation for semiconductor elements is expressed as, $$R = 0.61 \times \lambda / (n \times \sin \theta)$$

where
- $\lambda$: wavelength (μm) of light in a vacuum used for exposure,
- $n$: refractive index of ambient atmosphere in an exposure system,
- $\sin \theta$: fixed value of reduction lenses
- $n \times \sin \theta$: numerical aperture.

For larger integration of semiconductor elements, the pattern for the formation of the semiconductor element should be finely drawn and the resolution limit R of the pattern projection optics should be improved.

Accordingly, it has hitherto been contrived to minimize the exposure light wavelength or increase the fixed value $\sin \theta$ of the reduction lenses. However, the physical condition constrains the variation of these quantities to limits. It has been found that the conventional pattern projection and exposure has assumed to carry out the exposure in air or in a vacuum in which $n=1$ always stands. The present invention makes it possible to drastically improve the resolution limit R by using an optically transparent liquid having a refractive index n of more than 1 so as to thereby vary the numerical aperture, the resolution limit being inversely proportional to the numerical aperture.

Figure 2:
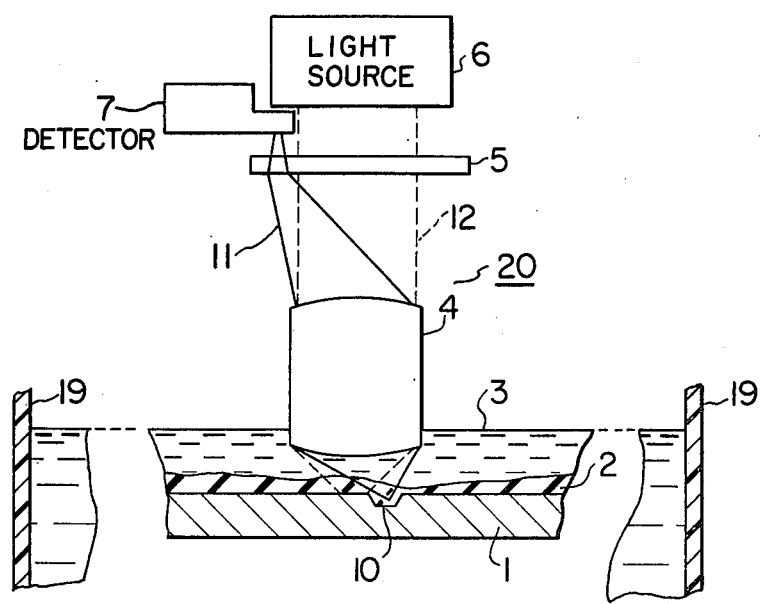
FIG. 2 is a schematic diagram showing a fundamental construction of a pattern forming apparatus embodying the invention.

Specifically, a pattern forming apparatus 20 of the invention has a fundamental construction as shown in FIG. 2. The apparatus 20 comprises an illumination system 6 comprised of a lamp housing unit and condenser lenses (not shown), a reticle 5 provided with a pattern, reduction lenses 4, a semiconductor substrate 1 carried on a wafer stage (not shown) and having a surface on which a photoresist layer 2 is formed, a liquid layer 3 filling a gap between the photoresist layer 2 and at least a portion of the reduction lenses 4, and a pattern detector 7 for positioning the reticle 5 and the substrate 1.

In operation, a positioning pattern formed on the reticle 5 and a positioning pattern 10 formed on the substrate 1 are first brought into alignment by means of the pattern detector 7 through the reduction lenses 4. An optical path 11 in this alignment process is shown by solid lines. Then, the reticle 5 provided with a predetermined magnified pattern is illuminated by the illumination system 6 to form an optical pattern image of the magnified pattern. This optical pattern image is reduced and projected by the reduction lenses 4 upon the photoresist layer 2 coated on the semiconductor substrate 1 to expose the photoresist layer 2. An optical path 12 in this process is shown by dotted lines. After the first exposure process, the wafer stage carrying the semiconductor substrate 1 is moved (stepped) and a next exposure field is exposed (i.e. exposure is repeated) in the same manner as the first exposure process. By repeating the exposure process, a predetermined pattern is formed over the entire area of the substrate 1. The pattern forming apparatus 20 of the type as described above is usually termed a reduction projection aligner, and its general construction is referred to as STEP & REPEAT CAMERA, for the detail of which reference may be made to U.S. Pat. No. 4,057,347.

The pattern forming apparatus 20, according to an embodiment of the present invention is featured by the use of the liquid layer 3 formed and sustained between the reduction lenses 4 and the photoresist layer 2 as has already been described above. The present embodiment defines the pattern forming apparatus 20 by the construction wherein the semiconductor substrate 1 provided with the photoresist layer 2 and a portion or the entirety of the reduction lenses 4 are immersed in the liquid layer 3. This liquid layer 3 contains a liquid which can transmit the optical pattern image, that is, optically transparent and has a refractive index of more the 1 (one). Needless to say, the liquid should not be reactive with materials of the reduction lenses 4, photoresist layer 2 and semiconductor substrate 1, i.e. should have chemically stable characteristics. Examplified as the liquid of this nature are trichlorotrifluoroethane ($C_2Cl_3F_3$), chlorobenzene ($C_6H_5Cl$), and water.

Figure 3:
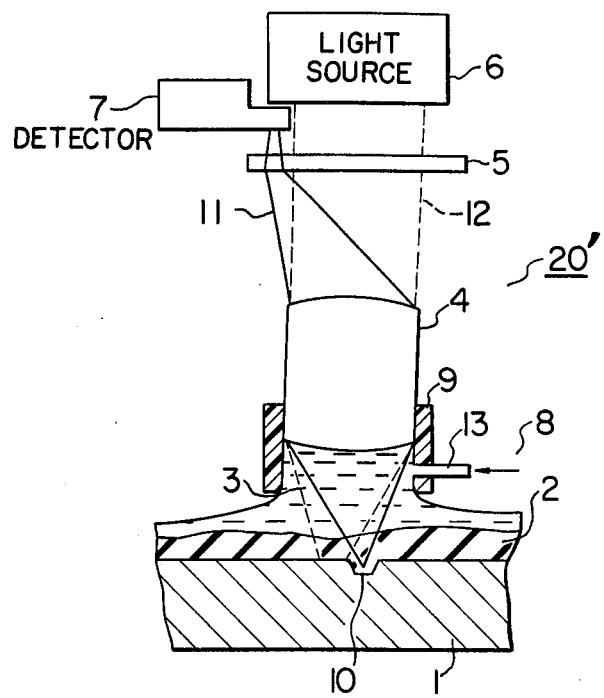
FIG. 3 is a schematic diagram of another embodiment of the invention.

In order to form and sustain the liquid layer 3, the liquid is filled in a pool 19 and the reduction lenses 4 and the semiconductor substrate 1 are disposed in the pool 19. Alternatively, in accordance with another embodiment 20' of the invention as shown in FIG. 3, a member 9 may be provided which surrounds the reduction lenses 4 and forms and sustains the liquid layer 3, and the sustaining member 9 may be equipped with a nozzle 13. Liquid supplied to the nozzle 13 in a direction of an arrow 8 may be drawn out toward the semiconductor substrate 1. With this modification also, the reduction lenses 4 and the photoresist layer 2 are put in immersion in the liquid layer 3.

Figure 4:
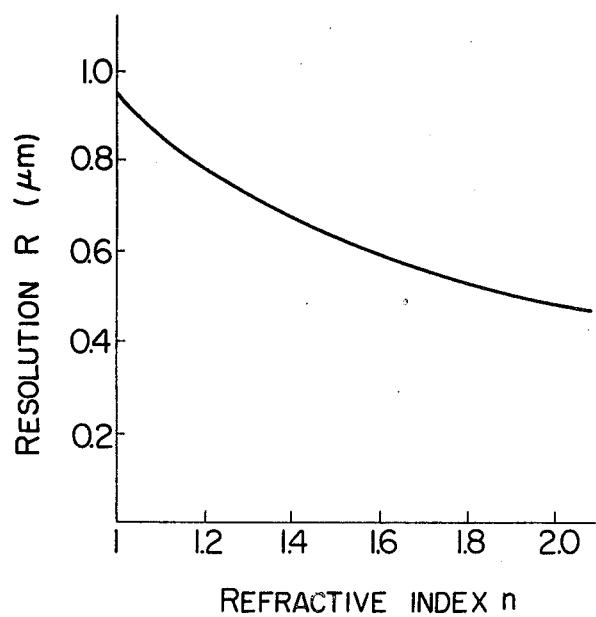
FIG. 4 is a graph useful in explaining effects brought about by the pattern forming apparatus of the invention.

According to the foregoing embodiments, when the refractive index n of atmosphere ambient of the exposure system is varied to be more than 1 (one) under the condition that a high resolution reduction lenses 4 usable and available for this invention has a fixed value as defined by $\sin \theta = 0.28$ at a wavelength $\lambda = 0.436$ μm, the resolution limit R is improved as shown in FIG. 4.

Specifically, while the conventional exposure in air achieves a resolvable line width or resolution limit R of 0.95 μm, the use of a liquid of, for example, n=1.36 or n=1.53 such as trichlorotrifluoroethane or chlorobenzene permits a drastic improvement of the resolution limit R to 0.69 μm or 0.62 μm.

When the refractive indices of the photoresist layer 2 formed on the substrate 1 and of the liquid layer 3 are made equal or almost equal, there occurs no or almost no such error in position detection, which is ascribed to the unevenness of the photoresist layer and has occurred in the conventional system upon detection of the pattern 10 by the position detector 7, even with a photoresist layer 2 having an uneven surface as shown in FIG. 2. In other words, the optical affect of the unevenness of the photoresist layer 2 can be eliminated essentially by melting the optical interface at the photoresist surface in an optically uniform medium, thereby ensuring a stable and highly precise pattern detection.

The present invention is also advantageous in that since the liquid used in the invention can be kept clean by, for example, distillation, it is expected that failure due to the deposition of dust or particles contained in air to the surface of the photoresist layer 2, which would occur in the conventional apparatus, can be prevented. Especially, when forming a fine exposure field of less than 1 μm line width with a reduction projection aligner, difficulties have been encountered in removing fine particles contained in air which may otherwise be deposited to the fine pattern. But, such difficulties can advantageously be overcome by the present invention.

Further, since the liquid layer 3 has a larger heat capacity than air, the substrate 1 can be less affected by temperature variations in the course of exposure and possible alignment error due to in-plane distortion of the substrate can be prevented in advance.

While the foregoing embodiments have been described by way of the reduction projecting aligner, the present invention may also be applied advantageously to a 1:1 projection aligner for forming a pattern on a substrate, and a checker or a measuring instrument for a fine pattern on a substrate.

What is claimed is:

1. A pattern forming apparatus for projecting a semiconductor device pattern, which is formed on a reticle, upon a photoresist layer on a substrate, comprising:
   an illumination system for illuminating said pattern to project an optical pattern image;
   a reduction lens system including at least one lens for projecting said optical pattern image at a certain reduction ratio upon the photoresist layer formed on the substrate for exposing the photoresist layer;
   liquid sustaining means for filling a gap between said at least one lens of said reduction lens system and said photoresist layer with an optically transparent liquid having a refractive index of more than 1 (one), whereby the resolution of the pattern forming apparatus including the reduction lens system is improved with respect to a pattern forming apparatus in which the gap is not filled with a liquid; and
   pattern detector means for detecting the alignment of patterns between said reticle and said substrate by light reflected from said substrate and transmitted through said photoresist layer, said liquid and said reduction lens system to be incident on said pattern detector means, the refractive index of said liquid being substantially equal to the refractive index of a material of said photoresist layer so that the light incident on said pattern detector means is not influenced by unevenness of said photoresist layer.

2. A pattern forming apparatus according to claim 1, wherein said pattern detector means is interposed between said illumination system and said reticle.

3. A pattern forming apparatus according to claim 1, wherein said substrate comprises a semiconductor substrate.

4. A pattern forming apparatus according to claim 1, wherein said liquid sustaining means comprises a nozzle for supplying said liquid, said nozzle being disposed at a position below said reduction lens system for enabling the flow of said liquid along the optical path of said reduction lens system.

5. A pattern forming apparatus according to claim 4, wherein said nozzle is positioned for directly supplying said liquid to the optical path of said reduction lens system and in a direction extending transversely to the optical path.

6. A pattern forming apparatus according to claim 1, wherein said liquid is trichlorotrifluoroethane or chlorobenzene.

7. A pattern forming apparatus for projecting a pattern formed on a reticle onto a photoresist layer formed on a substrate, comprising illuminating means for illuminating the pattern to project an optical pattern image, and image forming optic means having a numerical aperture, the image forming optic means including lens means having at least one reduction lens for projecting the optical pattern image at a predetermined reduction ratio onto the photoresist layer formed on the substrate for exposing the photoresist layer, liquid sustaining means for filling a gap between the at least one reduction leans and the photoresist layer with an optically transparent liquid having a refractive index of more than 1 (one) for enabling the optical pattern image to be projected onto the photoresist layer with improved resolution of the image forming optic means of the pattern forming apparatus by varying the numerical aperture of the image forming optic means with respect to an image forming optic means in which the gap is not filled with a liquid, and pattern detector means for detecting the alignment of patterns between the reticle and the substrate by light reflected from the substrate and incident upon the pattern detector means along a path through the photoresist layer, the liquid and the lens means, the refractive index of the liquid being substantially equal to a refractive index of a material of the photoresist layer so that the light incident upon the photodetector means is not influenced by unevenness of the photoresist layer and substantially no error occurs in the pattern detection alignment.

8. A pattern forming apparatus according to claim 7, wherein the pattern formed on the reticle is a semiconductor device pattern.

9. A pattern forming apparatus according to claim 7, wherein the pattern detector means is interposed between the illumination means and the reticle.

10. A pattern forming apparatus according to claim 7, wherein the substrate comprises a semiconductor substrate.

11. A pattern forming apparatus according to claim 7, wherein the liquid sustaining means comprises a nozzle for supplying the liquid, the nozzle being disposed at a position below the at least one reduction lens for enabling the flow of the liquid along the optical path of the at least one reduction lens.

12. A pattern forming apparatus according to claim 11, wherein the liquid sustaining means further includes casing means for at least partially surrounding the at least one reduction lens and extending in the direction of at least one reduction lens, the nozzle being disposed in the casing means.

13. A pattern forming apparatus according to claim 12, wherein the nozzle is disposed in the casing means for directly supplying the liquid to the optical path of the at least one reduction lens and in a direction extending transversely to the optical path.

14. A pattern forming apparatus according to claim 7, wherein the liquid is trichlorotrifluoroethane or chlorobenzene.

15. A pattern forming apparatus according to claim 7, wherein the numerical aperture of the image forming optic means is determined by n sin $\theta$ where n is the refractive index of the liquid and sin $\theta$ is the value of the at least one reduction lens, the resolution of the image forming optic means being inversely proportional to the numerical aperture.

* * * * *